United States Patent
Ye et al.

(10) Patent No.: US 9,508,677 B2
(45) Date of Patent: Nov. 29, 2016

(54) CHIP PACKAGE ASSEMBLY AND MANUFACTURING METHOD THEREOF

(71) Applicant: Silergy Semiconductor Technology (Hangzhou) LTD, Hangzhou, ZheJiang Province (CN)

(72) Inventors: Jiaming Ye, Hangzhou (CN); Junli Shentu, Hangzhou (CN)

(73) Assignee: Silergy Semiconductor Technology (Hangzhou) LTD, Hangzhou (CN)

(*) Notice: Subject to any disclaimer, the term of this patent is extended or adjusted under 35 U.S.C. 154(b) by 0 days.

(21) Appl. No.: 15/050,587

(22) Filed: Feb. 23, 2016

(65) Prior Publication Data
US 2016/0284663 A1 Sep. 29, 2016

(30) Foreign Application Priority Data
Mar. 23, 2015 (CN) ............ 2015 1 0126379

(51) Int. Cl.
*H01L 23/48* (2006.01)
*H01L 23/00* (2006.01)
(Continued)

(52) U.S. Cl.
CPC ............ *H01L 24/83* (2013.01); *H01L 21/565* (2013.01); *H01L 23/293* (2013.01); *H01L 24/27* (2013.01); *H01L 24/33* (2013.01); *H01L 2224/2919* (2013.01); *H01L 2224/29111* (2013.01); *H01L 2224/29139* (2013.01); *H01L 2224/29147* (2013.01); *H01L 2224/29166* (2013.01); *H01L 2224/32502* (2013.01); *H01L 2224/33505* (2013.01); *H01L 2224/8381* (2013.01); *H01L 2224/83359* (2013.01); *H01L 2924/0133* (2013.01); *H01L 2924/0665* (2013.01); *H01L 2924/182* (2013.01); *H01L 2924/186* (2013.01)

(58) Field of Classification Search
CPC .............. H01L 23/498; H01L 2924/19107; H01L 2224/73215; H01L 2224/4911; H01L 2224/4826; H01L 24/48; H01L 24/49
USPC ........ 257/666, 692, 693, 696, 787; 438/123, 438/124, 125, 127
See application file for complete search history.

(56) References Cited

U.S. PATENT DOCUMENTS

| | | | | |
|---|---|---|---|---|
| 4,288,842 A | * | 9/1981 | Voyles | ............ H01G 9/012 29/25.41 |
| 5,714,405 A | * | 2/1998 | Tsubosaki | ........... H01L 23/3107 257/E23.039 |
| 5,835,988 A | * | 11/1998 | Ishii | ................. H01L 23/3107 257/666 |

(Continued)

FOREIGN PATENT DOCUMENTS

| CN | 101241904 A | 8/2008 |
|---|---|---|
| CN | 101615609 A | 12/2009 |

*Primary Examiner* — S. V. Clark
(74) *Attorney, Agent, or Firm* — Michael C. Stephens, Jr.

(57) ABSTRACT

In one embodiment, a chip package assembly can include: a first substrate at a bottom layer, the first substrate having a first surface and a second surface opposite to the first surface, where the second surface is provided with a first group of inner leads; at least one chip layer above the first group of inner leads, where each of the chip layers comprises a third surface and a fourth surface opposite to the third surface, where electrodes on the third surface that that lie at the lowest level are electrically coupled to the first group of inner leads through a first connector; and a second substrate above the fourth surface on the topmost layer and having a fifth surface, and where the fifth surface is provided with a second group of inner leads electrically coupled to the electrodes on the fourth surface on the topmost layer.

20 Claims, 9 Drawing Sheets

(51) Int. Cl.
*H01L 23/29* (2006.01)
*H01L 21/56* (2006.01)

(56) References Cited

U.S. PATENT DOCUMENTS

| | | | |
|---|---|---|---|
| 6,730,544 B1 * | 5/2004 | Yang | H01L 23/3107 257/678 |
| 6,953,291 B2 * | 10/2005 | Liu | G02B 6/42 257/431 |
| 7,005,325 B2 * | 2/2006 | Chow | H01L 21/56 257/676 |
| 2003/0102489 A1 | 6/2003 | Nam | |
| 2004/0262774 A1 | 12/2004 | Kang et al. | |
| 2005/0275061 A1 | 12/2005 | Ohguro | |
| 2009/0039869 A1 | 2/2009 | Williams | |
| 2011/0134613 A1 | 6/2011 | Moussaoui | |
| 2011/0298528 A1 | 12/2011 | Endo | |
| 2012/0322202 A1 | 12/2012 | Nishimura | |
| 2013/0299957 A1 | 11/2013 | Kobayashi et al. | |

* cited by examiner

CHIP PACKAGE ASSEMBLY AND MANUFACTURING METHOD THEREOF

RELATED APPLICATIONS

This application claims the benefit of Chinese Patent Application No. 201510126379.5, filed on Mar. 23, 2015, which is incorporated herein by reference in its entirety.

FIELD OF THE INVENTION

The present invention relates to the field of chip packaging techniques and structures.

BACKGROUND

In a traditional front-mounted chip package assembly, the inactive face of a chip may be attached to a chip carrier substrate of a lead frame, while electrodes on the active face of the chip are connected to leads that lie around the carrier substrate via metal wires. This can couple the electrodes on the active face of the chip to an external circuit. However, such an approach may not be best suited to meet various semiconductor package size and thickness requirements with increasing demands on miniaturization, light weight, and multi-functionality of electronic components. In such a traditional package assembly utilizing wire bonding, because of the distance between leads and the carrier substrate, and the lead size, the height of the package assembly may be relatively large. In addition, there may be a relatively large parasitic resistance in the package assembly when metal wires are appthat lies to lead out electrodes, which can adversely affect the package quality.

SUMMARY

In one embodiment, a chip package assembly can include: (i) a first substrate at a bottom layer, the first substrate having a first surface and a second surface opposite to the first surface, where the second surface is provided with a first group of inner leads; (ii) at least one chip layer above the first group of inner leads, where each of the chip layers comprises a third surface and a fourth surface opposite to the third surface, where electrodes on the third surface that that lie at the lowest level are electrically coupled to the first group of inner leads through a first connector; (iii) a second substrate above the fourth surface on the topmost layer and having a fifth surface, where the fifth surface is provided with a second group of inner leads electrically coupled to the electrodes on the fourth surface on the topmost layer, and where the second substrate comprises a sixth surface opposite to the fifth surface; (iv) a plastic package in the space between the first and second substrates, where side surfaces of the plastic package expose the first and second groups of inner leads; and (v) first and second groups of outer leads on the side surfaces of the plastic package, being configured to electrically couple with the first and second groups of inner leads, and extending to the second surface or the sixth surface.

In one embodiment, a method of making a chip package assembly, can include: (i) forming a patterned conductive layer on a first surface of a first substrate as a first group of inner leads, where the first substrate comprises a second surface opposite the first surface; (ii) placing at least one chip on a first group of inner leads, where each of the chips comprises a third surface and a fourth surface opposite to the third surface, where the electrodes on the third surface at the lowermost level are electrically coupled to the first group of inner leads through a first connector; (iii) electrically coupling the second group of inner leads on a fifth surface of a second substrate to the electrodes on the fourth surface of the topmost layer through a second connector; (iv) filling a molding compound between the first and second substrates to form a plastic package, and exposing the first and second groups of inner leads on the side surface of the plastic package; and (v) forming first and second groups of outer leads on the side surface of the plastic package for electrical coupling with the first and second groups of inner leads, where the first and second groups of outer leads extend to the second surface or a sixth surface of the second substrate, where the sixth surface is opposite to the fifth surface.

DETAILED DESCRIPTION

Figure 1:
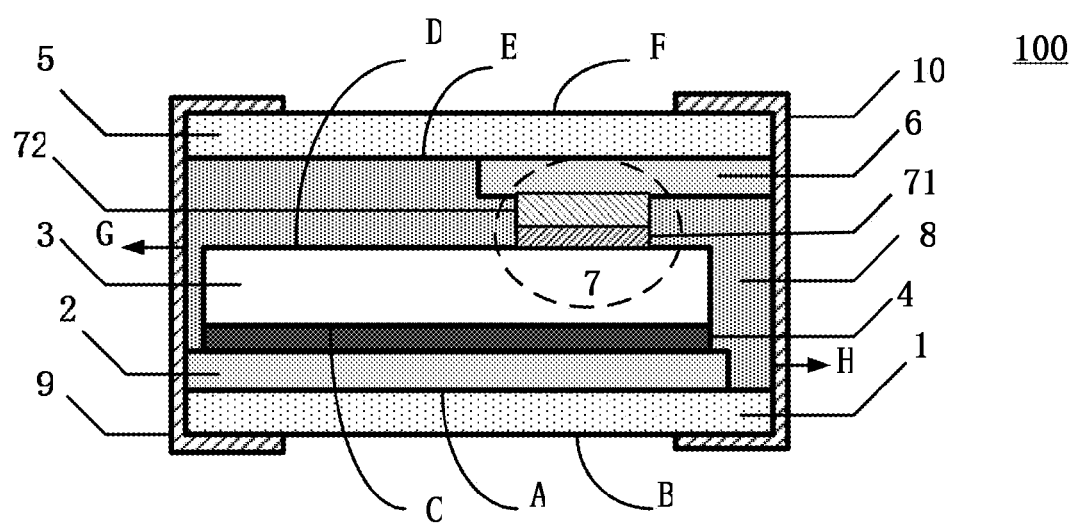
FIG. 1 is a cross-sectional view of an example chip package assembly, in accordance with embodiments of the present invention.

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

In particular embodiments, a chip package assembly can include a first substrate at the bottom layer, with a first surface and a second surface opposite to the first surface. The second surface may be provided with a first group of inner leads. The chip package assembly can also include at least one chip layer above the first group of inner leads. Each of the chip layers may have a third surface, and a fourth surface opposite to the third surface. Electrodes on the third surface that lie at the lowermost level can electrically connect to the first group of inner leads through a first connector. The chip package assembly can also include a second substrate above the fourth surface that lies on the topmost layer and has a fifth surface. The fifth surface can be provided with a second group of inner leads that can electrically connect to the electrodes on the fourth surface that lies on the topmost layer.

The second substrate may also have a sixth surface opposite to the fifth surface. A plastic package in certain embodiments can be configured to fill the space between the first substrate and the second substrate. Also, the side faces of the plastic package may expose the first group of inner leads and the second group of inner leads. A first group of outer leads and a second group of outer leads can both be arranged on the side faces of the plastic package, in order to electrically couple with the first group of inner leads and the second group of inner leads, respectively, and both can extend to the second surface or the sixth surface.

In certain embodiments, a chip package structure can include electrodes on the chip that are firstly lead out by the inner leads stacked with the chip, and are secondly electrically connected to corresponding outer leads that lies on the side faces of the plastic package. The outer leads may also extend to the lowermost face or the topmost face of the package assembly from the surface of the plastic package. In this way, the electrodes can be let out and connected to external circuitry directly above or directly below the chip layer. Thus, this approach can effectively reduce the chip package size and thickness, as well as improve thermal dissipation performance and package reliability. In particular embodiments, the packaged chip may include a chip layer or a plurality of chip layers. In the examples below, only one chip layer is shown; however, those skilled in the art will recognize that two chip layers or more than two chip layers can also be included in certain embodiments.

Referring now to FIG. 1, shown is a cross-sectional view of an example chip package assembly, in accordance with embodiments of the present invention. This example chip package assembly can include substrate 1 that lies at the bottom layer, with surfaces A and B. Surface A can be provided with a first group of inner leads 2. Chip 3 may lie above the first group of inner leads, and have surface C, as well as surface D opposite to surface C. electrodes on surface C can electrically connect to the first group of inner leads 2 through connector 4. Also, substrate 5 may lie above chip 3 and have surface E. Surface E can be provided with a second group of inner leads 6 electrically connected to the electrodes on surface D through connector 7.

Plastic package 8 can be configured to fill the gap between substrates 1 and 2. Plastic package 8 may have side surfaces G and H. Side surface G may expose the first group of inner leads 2, and side surface H may expose the second group of inner leads 6. A first group of outer leads 9 that lies on side surface G can electrically connect to the first group of inner leads 2, and may extend to one side of surface B. A second group of outer leads 10 that lies on side surface H can electrically connect to the second group of inner leads 6, and may extend to the other side of surface B.

In this example, the first and second groups of inner leads may respectively lie on the first side and second sides of the plastic package, in order to facilitate the arrangement of electrodes outside the package assembly. In example chip package assembly 100, substrates 1 and 5 can be made of an insulating material (e.g., the plastic material used for forming plastic package 8). Also, the number of inner leads in the first and second groups of inner leads can be set according to the electrodes or circuits on surfaces C and D. Also, the number of outer leads in the first and second groups of outer leads can be set according to the respective number of inner leads in the first and second groups of inner leads. In some cases, the numbers of the inner leads of the first and second groups may be the same as the number of electrodes on surfaces C and D, and the outer leads of the first and second groups may also have the same number. However, the numbers of the electrodes, as well as inner leads and outer leads may be set according to various circuit requirements, and need not be the same as each other. In one example package assembly 100, there may be one electrode on surface C and three electrodes on surface D.

Figure 2:
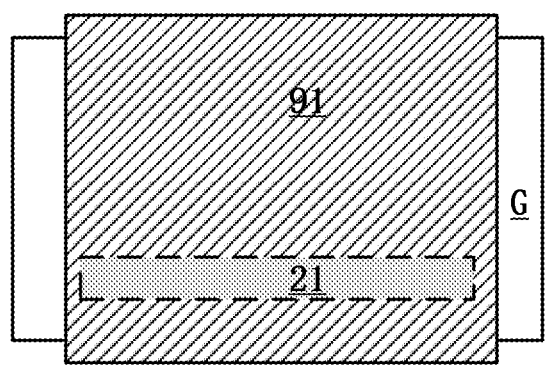
FIG. 2 is a side view of an example chip package assembly viewed from a first side direction, in accordance with embodiments of the present invention.
Figure 3:
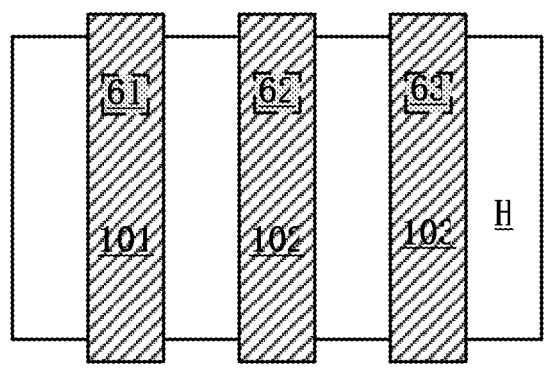
FIG. 3 is a side view of an example chip package assembly viewed from a second side direction, in accordance with embodiments of the present invention.
Figure 4:
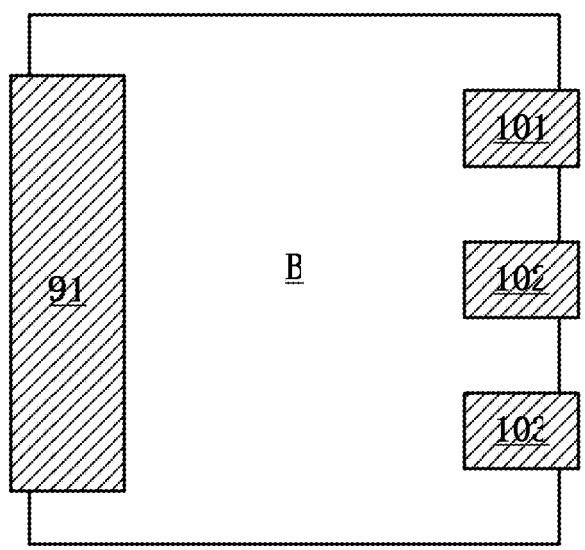
FIG. 4 is a bottom view of an example chip package assembly, in accordance with embodiments of the present invention.

Referring now to FIGS. 2, 3, and 4 shown are side (from first and second side directions) and bottom views of an example chip package assembly, in accordance with embodiments of the present invention. FIG. 2 shows a side view of the package assembly taken from side surface G. FIG. 3 shows a side view taken from side surface H. FIG. 4 shows a bottom view of the package assembly. As shown, the first group of inner leads 2 can include inner lead 21, and the first group of outer leads 9 can include outer lead 91. Outer lead 91 may be arranged on side surface G, can electrically connect to inner lead 21, and can further extend to one side of surface B, so as to lead the electrodes on surface C to one side of surface B, and provide electrical connectivity with external circuitry.

The second group of inner leads 6 can include inner leads 61, 62, and 63. The second group of outer leads 10 can include outer leads 101, 102, and 103 arranged on side surface G to be respectively electrically connected to inner leads 61, 62 and 63, and to further extend to the other side of surface B, so as to lead the electrodes on surface D to the other side of surface B to provide electrical connectivity with external circuitry. Therefore, in package assembly 100, the first group of inner leads 2, chip 3, and the second group of inner leads 6 may be arranged in a stack. Also, the distance from chip 3 to side surface H may be larger than the distance between the second group of inner leads and surface H. Thus, the size of the stacked structure may be slightly larger than chip 3. Further, the first and second groups of outer leads for leading out the chip can be arranged at two sides of the package assembly and may respectively extend to two sides of the second surface. Thus, the size of package assembly 100 may be relatively close to chip 3, in order to achieve high packaging efficiency.

In addition, the first and second groups of outer leads can be exposed outside the package assembly, in order to facilitate heat dissipation of the package assembly. The first and second groups of outer leads may be attached to two sides of the package assembly, and may extend to two sides of surface B. For example, each of the two groups of outer leads can be made of one or more copper layers, or one or more silver layers, arranged on the package assembly, or a metal layer with good adhesion to the molding compound, and a tin layer arranged on the copper, silver, or other metal layer.

In example package assembly 100, substrate 5 can also include surface F opposite to surface E. The first and second groups of outer leads may further respectively extend to the two sides of surface F. Package assembly 100 may be flexible to connect to an external circuitry by attaching surface B to a printed circuit board, by attaching surface F to the printed circuit board, or by attaching to the printed circuit boards through both surfaces. In example package assembly 100, connector 4 for electrically connecting the electrodes on surface C to the first group of inner leads 2 can include one of silver epoxy and soldering tin. The electrodes on the third surface can electrically connect to the first group of inner leads by way of form-in-place or soldering. In these examples, connector 4 can be a eutectic connection structure, which can include a first eutectic layer on the first group of inner leads 2 and a second eutectic layer on the electrodes arranged on surface C.

Moreover, in package assembly 100, connector 7 circled by dashed lines for electrically connecting the electrodes on surface D and the second group of inner leads 6 may be in the form of a eutectic connection structure. Connector 7 can include eutectic layer 71 on the electrodes of surface D, and eutectic layer 72 on the second group of inner leads 6. Eutectic layers 71 and 72 may be configured to form the eutectic connection. Eutectic layers 71 and 72 can be made of a material that can achieve good eutectic connection. For example, eutectic layer 71 can be a titanium-nickel-silver alloy layer, and eutectic layer 72 can be a silver metal layer or a tin metal layer. The thickness of the package assembly can be decreased by using the eutectic connection to electrically connect the chip electrodes with the inner leads, and the manufacturing process may simplified relative to using bonding wires. In other examples, the second connector can include conductive bumps or solder bumps between the electrodes of surface D and the second group of inner leads.

Chip package assembly 100 as shown may have one chip layer, and the chip layer can include one chip 3. However, in some examples, each chip layer can include several chips, with electrodes on the surfaces C and D of the same chip layer being lead out in the same way. Also, in some examples, there may be two, or more than two, chip layers in the package assembly. When packaging at least two chip layers (e.g., at least one chip layer between chip 3 of the package assembly and the second group of inner leads 6), the package assembly also can include an interlayer inner lead group between two chip layers, and an interlayer outer lead group on the side surface of the package assembly, and extending to surface B or F. Each chip layer may have surfaces C and D in correspondence with C and D surfaces shown in chip 3, and the electrodes on each of C surfaces above the corresponding C surface of the bottom layer (e.g., surface C of one chip layer above chip 3) can electrically connect to the interlayer inner lead group placed below surface C through a first middle connector. The electrodes on each of the surfaces D below the corresponding surface D of the top layer can electrically connect to the interlayer inner lead group through a second middle connector. The interlayer inner lead group may be exposed on the side surfaces of the package assembly, and can electrically connect to interlayer outer lead group.

In one example chip package assembly, the electrodes on surfaces C and D may be respectively lead out from the first group of inner leads, the second group of inner leads, and the interlayer inner leads. The first group of outer leads, the second group of outer leads, the interlayer outer lead group may be arranged on the side surfaces of the package assembly, and can extend to the lowermost layer or the topmost layer of the package assembly to electrically connect to the first group of inner leads, the second group of inner leads, and the interlayer inner lead group, so as to lead the electrodes on the chip out to external circuitry of the package assembly. This can reduce the package size and thickness of the chip, and may improve packaging efficiency. In addition, the parasitic resistance of the chip package may be decreased by leading out the electrodes through the inner and outer leads, and heat dissipation of the package assembly may be improved by exposing the outer leads of the package assembly outside the plastic package.

In certain embodiments, a manufacturing method of a chip package assembly can include forming a patterned conductive layer on a first surface of a first substrate as a first group of inner leads. The first substrate may also have a second surface corresponding to the first surface. The method may also include placing at least one chip on a first group of inner leads, where each of the chips has a third surface and a fourth surface opposite to the third surface. The electrodes on the third surface at a lowermost level can electrically connect to the first group of inner leads through a first connector. The method may also include electrically coupling the second group of inner leads on a fifth surface of a second substrate to the electrodes on the fourth surface of the topmost layer through a second connector.

The method of making a chip package assembly in certain embodiments can also include placing the molding compound between the first substrate and the second substrate to form a plastic package. The method can also include exposing the first group of inner leads and the second group of inner leads on the side surface of the plastic package. The method can also include forming a first group of outer leads and a second group of outer leads on the side surface of the plastic package to electrically connect with the first group of inner leads and the second group of inner leads. The first and second groups of outer leads may both extend to the second surface or a sixth surface of the second substrate, where the sixth surface is opposite to the fifth surface.

Figure 5A:
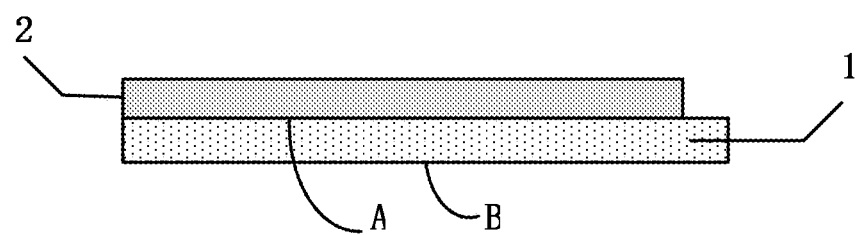
FIGS. 5A to 5E are cross-sectional views of an example chip package assembly during various manufacturing steps, in accordance with embodiments of the present invention.

Referring now to FIGS. 5A to 5E, shown are cross-sectional views of an example chip package assembly during various manufacturing steps, in accordance with embodiments of the present invention. As shown in FIG. 5A, a patterned conductive layer can be formed on surface A of substrate 1 to be a first group of inner leads 2. The number of leads in the first group of inner leads 2 or the pattern of the conductive layer may be determined by electrodes or circuits on chip 3. Substrate 1 may also include surface B opposite to surface, and substrate 1 can be made of an insulating material.

Figure 5B:
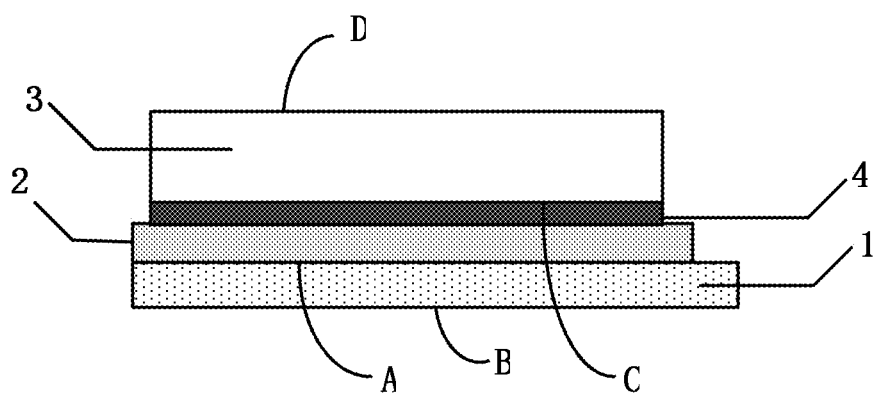

As shown in FIG. 5B, the electrodes on surface C of chip 3 can be electrically coupled to the first group of inner leads 2 through connector 4. Chip 3 also can include surface D opposite to surface C. Connector 4 used to electrically couple the electrodes on surface C to the first group of inner leads 2 can be silver epoxy or soldering tin. For example, the electrodes on surface C can electrically connect to the first group of inner leads 2 by way of form-in-place or soldering. In these examples, connector 4 can be a eutectic connection structure, which can include eutectic layer 71 on the first group of inner leads 2 and eutectic layer 72 on the electrodes arranged on surface C.

Figure 5C:
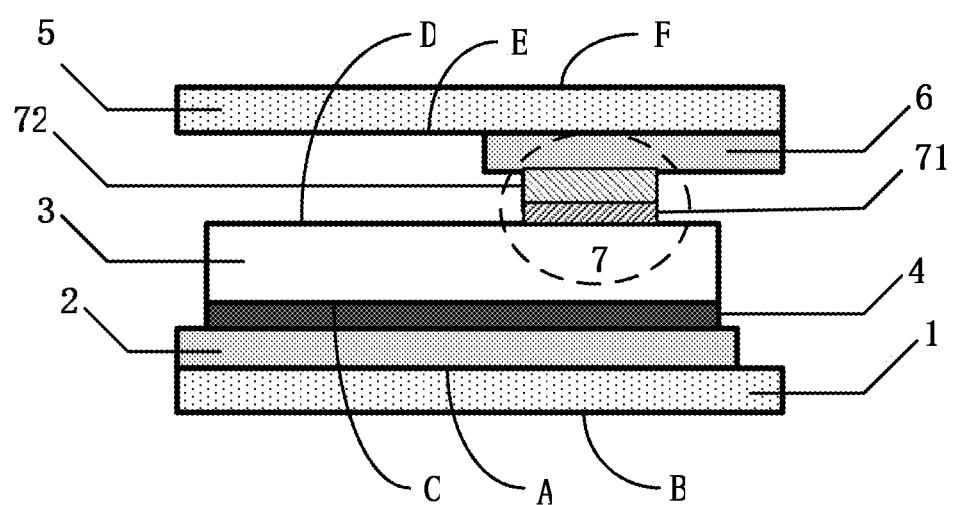

As shown in FIG. 5C, substrate 5 can be provided with a second group of inner leads 6 on surface E, and the second group of inner leads 6 can be electrically coupled to surface D through connector 7. Prior steps can also include forming a patterned conducting layer on substrate 5 to form a second group of inner leads 6. The number of leads in the second group of inner leads 6 or the pattern of the conductive layer can be determined by the electrodes or circuits on surface D of chip 3. For example, substrate 5 can be made of the same insulating material as substrate 1.

Moreover, connector 7 circled by dashed lines for electrically connecting the electrodes on surface D and the second group of inner leads 6 can be in a form of eutectic connection structure. That is, connector 7 can include eutectic layer 71 on the electrodes of surface D, and eutectic layer 72 on the second group of inner leads 6, where eutectic layers 71 and 72 form the eutectic connection. Eutectic connection structures 71 and 72 can be made of any suitable material that can achieve good eutectic connection. For example, a titanium-nickel-silver alloy layer can be formed on the electrodes of surface D as eutectic layer 71, and a silver or tin metal layer can be formed on inner leads 6 as eutectic layer 72. In this way, the chip electrodes and inner leads can be electrically connected through a eutectic connection process. Therefore, the thickness of the package assembly can be decreased by using the eutectic connection process relative to a traditional bonding leads, and the manufacturing process can be simplified. Of course, in some examples connector 7 can be implemented as conductive bumps or solder bumps between the electrodes of surface D and the second group of inner leads.

Figure 5D:
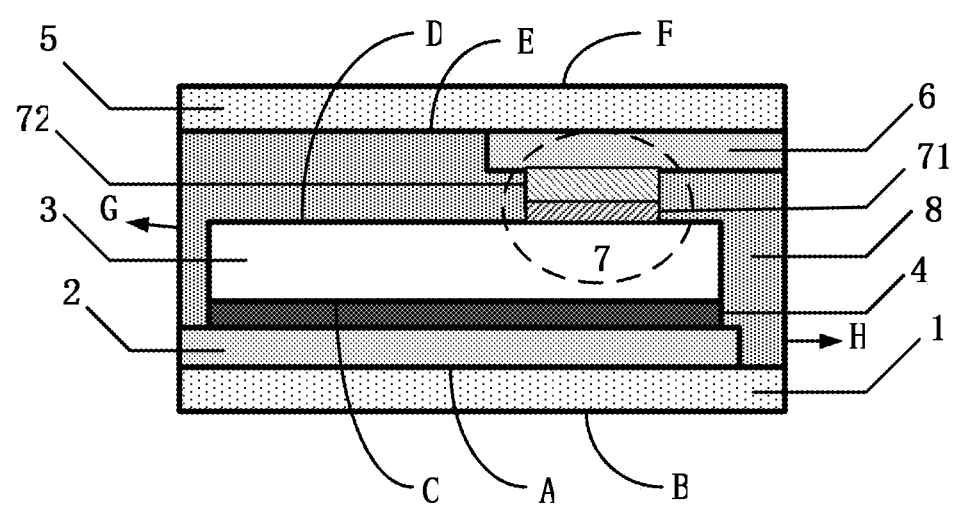

As shown in FIG. 5D, a molding compound can fill in the gap between substrates 1 and 5, to form plastic package 8 having side surfaces G and H. This structure can expose first group of inner leads 2 on side surface G, and the second group of inner leads 6 on the second group of inner leads 6 on surface H. Side surface G may be opposite to side surface H. One example method of exposing the first group of inner leads 2, the second group of inner leads 6 on side surface G and side surface H can include cutting and polishing two sides of the plastic package after filling the molding compound between substrates 1 and 2, to respectively expose side surfaces A and B of the first group of inner leads and the second group of inner leads. Also for example, package 8 can be made of the same material as substrates 1 and 6.

Figure 5E:
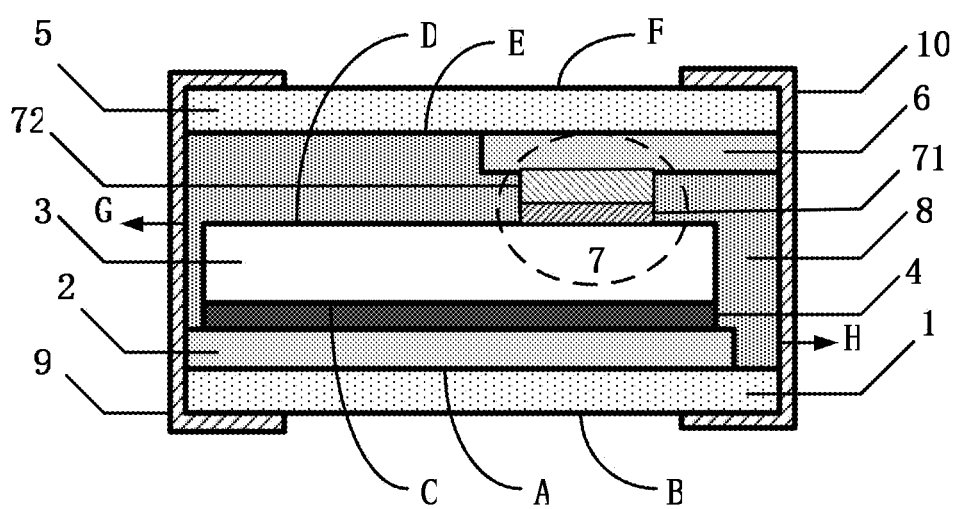

As shown in FIG. 5E, a first group of outer leads 9 can be formed to electrically connect with the first group of inner leads 2 on side surface G, and a second group of outer leads 10 can be formed to electrically connect with the second group of inner leads 6 on side surface H. The first group of outer leads 9 may extend to one side of surface B, and the second group of outer leads 10 can extend to the other side of surface B. Substrate 5 may also have surface F opposite to surface E. In some examples, the first and second groups of outer leads 9 and 10 can be extended to two sides of surface F. In this way, the package assembly can connect to external circuitry through surface B, and may also connect to external circuitry through surface F.

In some examples, the step of forming the first and second groups of outer leads 9 and 10 can include exposing the outer lead regions of the first and second groups of outer leads 9 and 10 via a mask, growing a copper layer or a silver layer on the outer lead region by using electroplating process, and coating a tin or other metal layer on the surface of the copper layer or the silver layer. For example, the tin layer may at least cover the copper layer or the silver layer, and can extend to surface B, so as to facilitate a direct paste of the chip package assembly on a printed circuit board.

In particular embodiments, a plurality of chip layers can be assembled on the first group of inner leads. For example, first and second chip layers can be included, such as between connecting the electrodes on surface C of the first chip layer to the first group of inner leads through a first connector, and electrically connecting the second group of inner leads on surface E of substrate 2 to surface D of the second chip layer. In addition, the interlayer inner leads on the middle substrate can be electrically connected to the electrodes on surface D of the first chip layer through a second middle connector. Also, the middle substrate can be removed, and surface C of the second chip layer can be electrically connected to the interlayer inner lead group through a second middle connector.

For a package assembly with two chip layers, forming a plastic package by filling molding compound between substrates 1 and 2 can include, between electrically connecting the interlayer inner lead group on the middle substrate to the electrodes on surface D of the first chip layer through the second middle connector, and electrically connecting surface C of the second chip layer to the interlayer inner lead group through the second middle connector after removing the middle substrate, the molding compound can be filled between substrate 1 and the middle substrate to form a first layer of plastic package to cover the first chip layer. Also, the first group of inner leads and interlayer inner lead group can be exposed on the side surface of the first layer of the plastic package.

After electrically connecting the second group of inner leads on surface E of substrate 2 to the electrodes on surface D of the second chip layer, molding compound can be filled between the first layer of the plastic package and substrate 2 to form a second layer of the plastic package to cover the second chip layer. Also, the second group of inner leads can be exposed on the side surface of the second plastic package. The first and second plastic packages can be configured as an entire plastic package. In addition, an interlayer outer lead group can be formed on the side surface of the plastic package. The interlayer outer lead group can electrically connect with the interlayer inner lead group, and may extend to surface B or surface F.

Therefore, the electrodes on surfaces C and D can respectively be lead out from the first group of inner leads, the second group of inner leads and the interlayer inner leads, the first group of outer leads, and the second group of outer leads. The interlayer of outer lead group can be arranged on the side surfaces of the package assembly, and may extend to the lowermost layer or the topmost layer of the package assembly to electrically connect to the first group of inner leads, the second group of inner leads, the interlayer inner lead group. Thus, the electrodes on the chip can be lead out to external circuitry of the package assembly, which can reduce the package size and thickness of the chip, and improve packaging efficiency. Also, the parasitic resistance of the chip package may be decreased by leading out the electrodes through the inner and outer leads, and heat dissipation of the package assembly can be improved by exposing the outer leads of the package assembly outside the plastic package.

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:
1. A chip package assembly, comprising:
   a) a first substrate at a bottom layer, the first substrate having a first surface and a second surface opposite to said first surface, wherein said second surface is provided with a first group of inner leads;
   b) at least one chip layer above said first group of inner leads, wherein each of said chip layers comprises a third surface and a fourth surface opposite to said third surface, wherein electrodes on said third surface that that lie at the lowest level are electrically coupled to said first group of inner leads through a first connector;
   c) a second substrate above said fourth surface on the topmost layer and having a fifth surface, wherein said fifth surface is provided with a second group of inner leads electrically coupled to the electrodes on said fourth surface on the topmost layer, and wherein said second substrate comprises a sixth surface opposite to said fifth surface;

d) a plastic package in the space between said first and second substrates, wherein side surfaces of said plastic package expose said first and second groups of inner leads; and e) first and second groups of outer leads on the side surfaces of said plastic package, being configured to electrically couple with said first and second groups of inner leads, and extending to said second surface or said sixth surface.

2. The chip package assembly of claim 1, wherein said plastic package comprises:

a) a first side surface that exposes said first group of inner leads; and b) a second side surface opposite to said first side surface, and that exposes said second group of inner leads, wherein said first group of outer leads are arranged on said first side surface and extending to said second surface or to one side of said sixth surface, and wherein said second group of outer leads are arranged on the other side of said second surface and extending to said second surface or to the other side of said sixth surface.

3. The chip package assembly of claim 2, wherein said first connector comprises silver epoxy soldering tin, or a first eutectic layer above said first group of inner leads and a second eutectic layer above said third surface, wherein said first and second eutectic layers form a eutectic connection.

4. The chip package assembly of claim 3, wherein said second connector comprises a eutectic connection having third eutectic layer on electrodes of said fourth surface and a fourth eutectic layer on said second group of inner leads, conductive bumps, or soldering bumps between electrodes of said fourth surface and said second group of inner leads.

5. The chip package assembly of claim 4, wherein said third eutectic layer comprises a titanium-nickel-silver alloy layer, and wherein said fourth eutectic layer comprises a silver metal layer or a tin metal layer.

6. The chip package assembly of claim 4, wherein first ends of said first and second groups of outer leads extend to two sides of said second surface, and second ends sf said first and second groups of outer leads extend to two sides of said sixth surface.

7. The chip package assembly of claim 6, wherein each of said first group of outer leads and said second group of outer leads comprises a copper layer or a silver layer that connected with said plastic package, and a thin layer above said copper layer or said silver layer.

8. The chip package assembly of claim 2, wherein said package assembly comprises:

a) a plurality of chip layers, an interlayer inner lead group between every two of said chip layers, and an interlayer outer lead group on the side surface of said plastic package and that extends to said second surface or said sixth surface;

b) wherein electrodes on each of said third surfaces that are above said third surface at the lowermost level are electrically coupled to the interlayer inner lead group below through a first middle connector;

c) wherein the electrodes on each of said fourth surfaces that are above said fourth surface at the topmost layer are electrically coupled to the interlayer inner lead group above through a second middle connector; and d) said interlayer inner lead group being exposed on the side surface of said plastic package and electrically coupled with said interlayer outer lead group.

9. The chip package assembly of claim 8, wherein said plastic package comprises a plurality of plastic package layers, and each of said plastic package layers covers one chip layer.

10. A method of making a chip package assembly, the method comprising:

a) forming a patterned conductive layer on a first surface of a first substrate as a first group of inner leads, wherein said first substrate comprises a second surface opposite said first surface;

b) placing at least one chip on a first group of inner leads, wherein each of said chips comprises a third surface and a fourth surface opposite to said third surface, wherein the electrodes on said third surface at the lowermost level are electrically coupled to said first group of inner leads through a first connector;

c) electrically coupling said second group of inner leads on a fifth surface of a second substrate to said electrodes on said fourth surface of the topmost layer through a second connector;

d) filling a molding compound between said first and second substrates to form a plastic package, and exposing said first and second groups of inner leads on said side surface of said plastic package; and e) forming first and second groups of outer leads on the side surface of said plastic package for electrical coupling with said first and second groups of inner leads, wherein said first and second groups of outer leads extend to said second surface or a sixth surface of said second substrate, wherein said sixth surface is opposite to said fifth surface.

11. The method of claim 10, wherein said plastic package comprises:

a) a first side surface exposing said first group of inner leads, a second side surface opposite to said first side surface and exposing said second group of inner leads; and b) said first group of outer leads being arranged on said first side surface and extending to said second surface or one side of said sixth surface, wherein said second group of outer leads are arranged on the other side of said second surface and extend to said second surface or the other side of said sixth surface.

12. The method of claim 11, further comprising forming a patterned conductive layer on said fifth surface as said second group of inner leads before electrically connecting said second group of inner leads to the electrodes on said fourth surface through said second connector.

13. The method of claim 12, further comprising forming said first connector of silver epoxy or soldering tin, or forming said first connector by a first eutectic layer above said first group of inner leads, and a second eutectic layer above said third surface, wherein said first and second eutectic layers form a eutectic connection.

14. The method of claim 13, wherein said second connector comprises a eutectic connection having a third eutectic layer on electrodes of said fourth surface and a fourth eutectic layer on the second group of inner leads, conductive bumps, or soldering bumps between electrodes of said fourth surface and said second group of inner leads.

15. The method of claim 14, further comprising forming a titanium nickel silver alloy layer on the electrodes of said fourth surface as said third eutectic layer, and forming a silver metal layer or a tin metal layer on said second group of inner leads.

16. The method of claim 15, further comprising extending first ends of said first group and second groups of outer leads to two sides of said second surface, and extending second ends of said first group and second groups of outer leads to two sides of said sixth surface.

17. The method of claim 10, wherein said forming said first and second groups of outer leads comprises:
   a) exposing an outer lead region of said first and second groups of outer leads via a mask,
   b) growing a copper layer or a silver layer on said outer lead region by using an electroplating process; and
   c) coating a tin layer on a surface of said copper layer or said silver layer.

18. The method of claim 10, wherein said chip layers above said first group of inner leads comprises, between electrically connecting the electrodes on said third surface of a first chip layer to said first group of inner leads through said first connector, and electrically connecting the electrodes on said fifth surface of said second substrate to the electrodes on said fourth surface of a second chip layer above said first chip layer:
   a) electrically connecting said interlayer inner leads on a middle substrate to the electrodes on said fourth surface of said first chip layer through a second middle connector; and
   b) removing said middle substrate, and electrically connecting said third surface of said second chip layer to set interlayer inner lead group through said second middle connector.

19. The method of claim 18, further comprising filling said molding compound between said first substrate and said second substrate to form said plastic package comprises, between said electrically connecting said interlayer inner lead group on the middle substrate to the electrodes on said fourth surface of said first chip layer through said second middle connector, and said electrically connecting said third surface of said second chip layer to said interlayer inner lead group through said second middle connector after removing said middle substrate:
   a) filling said molding compound between said first substrate and said middle substrate to form a first layer of plastic package to cover said first chip layer, and exposing said first group of inner leads and interlayer inner lead group on said side surface of said first layer of said plastic package; and
   a) after electrically connecting said second group of inner leads on said fifth surface of said second substrate to said electrodes on said fourth surface of said second chip layer, filling said molding compound between said first layer of said plastic package and said second substrate to form a second layer of said plastic package to cover said second chip layer, and exposing said second group of inner leads on the side surface of said second plastic package.

20. The method of claim 19, further comprising forming an interlayer outer lead group on said side surface of said plastic package, wherein said interlayer outer lead group is electrically coupled with said interlayer inner lead group and extends to said second surface or said sixth surface.

\* \* \* \* \*